(12) United States Patent
Lu et al.

(10) Patent No.: US 10,163,655 B2
(45) Date of Patent: Dec. 25, 2018

(54) THROUGH SUBSTRATE VIA LINER DENSIFICATION

(71) Applicant: MICRON TECHNOLOGY, INC., Boise, ID (US)

(72) Inventors: Jin Lu, Boise, ID (US); Rita J. Klein, Boise, ID (US); Diem Thy N. Tran, Garden City, ID (US); Irina V. Vasilyeva, Boise, ID (US); Zhiqiang Xie, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 19 days.

(21) Appl. No.: 14/948,074

(22) Filed: Nov. 20, 2015

(65) Prior Publication Data

US 2017/0148674 A1 May 25, 2017

(51) Int. Cl.
| | |
|---|---|
| H01L 29/40 | (2006.01) |
| H01L 21/321 | (2006.01) |
| H01L 21/768 | (2006.01) |
| H01L 21/02 | (2006.01) |
| H01L 21/311 | (2006.01) |
| H01L 23/48 | (2006.01) |

(52) U.S. Cl.
CPC .... *H01L 21/3212* (2013.01); *H01L 21/02063* (2013.01); *H01L 21/02274* (2013.01); *H01L 21/31116* (2013.01); *H01L 21/76831* (2013.01); *H01L 21/76898* (2013.01); *H01L 23/481* (2013.01); *H01L 21/76828* (2013.01)

(58) Field of Classification Search
CPC ............. H01L 21/76898; H01L 23/481; H01L 21/76831; H01L 2224/94; H01L 2225/06541
See application file for complete search history.

(56) References Cited

U.S. PATENT DOCUMENTS

| | | | | |
|---|---|---|---|---|
| 6,012,469 | A * | 1/2000 | Li | H01L 21/02063 134/1.3 |
| 6,642,146 | B1 * | 11/2003 | Rozbicki | H01L 21/76805 438/622 |
| 6,927,107 | B1 * | 8/2005 | Makita | H01L 21/2022 257/66 |
| 2007/0128869 | A1 * | 6/2007 | Chen | C22F 1/02 438/687 |
| 2007/0196011 | A1 * | 8/2007 | Cox | G01N 21/33 382/145 |
| 2008/0032482 | A1 * | 2/2008 | Tsai | H01L 21/76224 438/424 |
| 2008/0171433 | A1 * | 7/2008 | Huang | H01L 21/76811 438/637 |
| 2009/0321796 | A1 * | 12/2009 | Inohara | H01L 21/76898 257/288 |

(Continued)

Primary Examiner — Joseph C Nicely
Assistant Examiner — David Goodwin
(74) Attorney, Agent, or Firm — Dorsey & Whitney LLP

(57) ABSTRACT

Apparatuses and methods are disclosed herein for densification of through substrate insulating liners. An example method may include forming a through substrate via through at least a portion of a substrate, forming a first liner layer in the through substrate via, and densifying the first liner layer. The example method may further include forming a second liner layer on the first liner layer, and densifying the second liner layer.

22 Claims, 6 Drawing Sheets

(56) References Cited

U.S. PATENT DOCUMENTS

| | | | |
|---|---|---|---|
| 2012/0139127 A1* | 6/2012 | Beyne | H01L 21/764 257/774 |
| 2012/0217611 A1 | 8/2012 | Liu et al. | |
| 2012/0261827 A1* | 10/2012 | Yu | H01L 21/76898 257/774 |
| 2013/0193548 A1* | 8/2013 | Kim | H01L 21/76229 257/506 |
| 2013/0252416 A1 | 9/2013 | Takeda et al. | |
| 2014/0110374 A1 | 4/2014 | Brencher et al. | |
| 2015/0203967 A1* | 7/2015 | Dhas | C23C 16/401 427/535 |
| 2016/0118339 A1* | 4/2016 | Kar-Roy | H01L 21/74 257/763 |

* cited by examiner

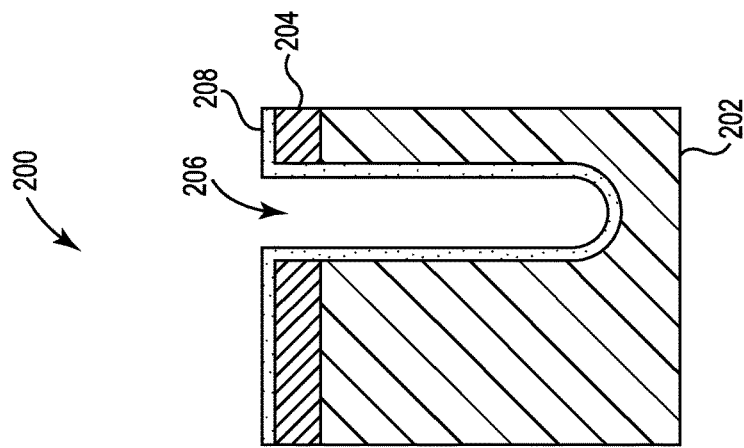
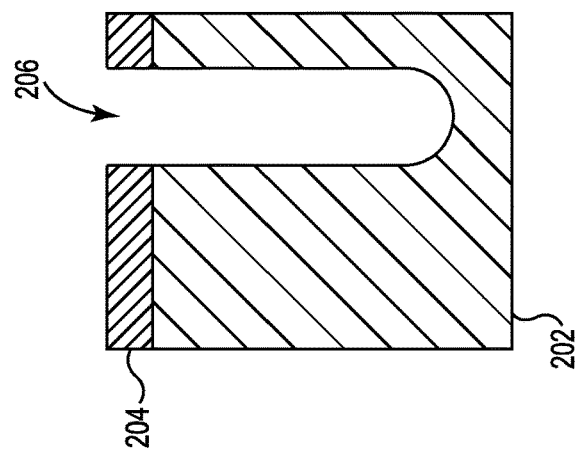
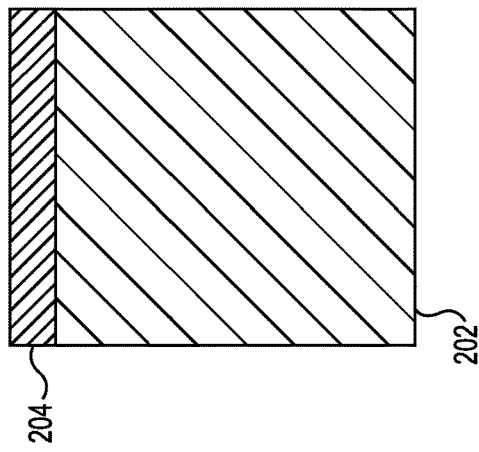

THROUGH SUBSTRATE VIA LINER DENSIFICATION

BACKGROUND

Semiconductor devices that include through substrate conductive paths may have concerns regarding reliability and performance. The reliability issues, for example, may be related to the added stresses associated with the materials formed in through substrate openings used for the conduction paths. Additionally, the conductive paths formed in the through substrate openings, if not optimized, may reduce operating speeds due to associated parasitic capacitances, for example. Addressing both performance and reliability problems is desirable.

BRIEF DESCRIPTION OF THE DRAWINGS

FIGS. 2A-2H show cross-sectional views of a substrate at various stages of a process according to an embodiment of the present disclosure.

DETAILED DESCRIPTION

Figure 1:
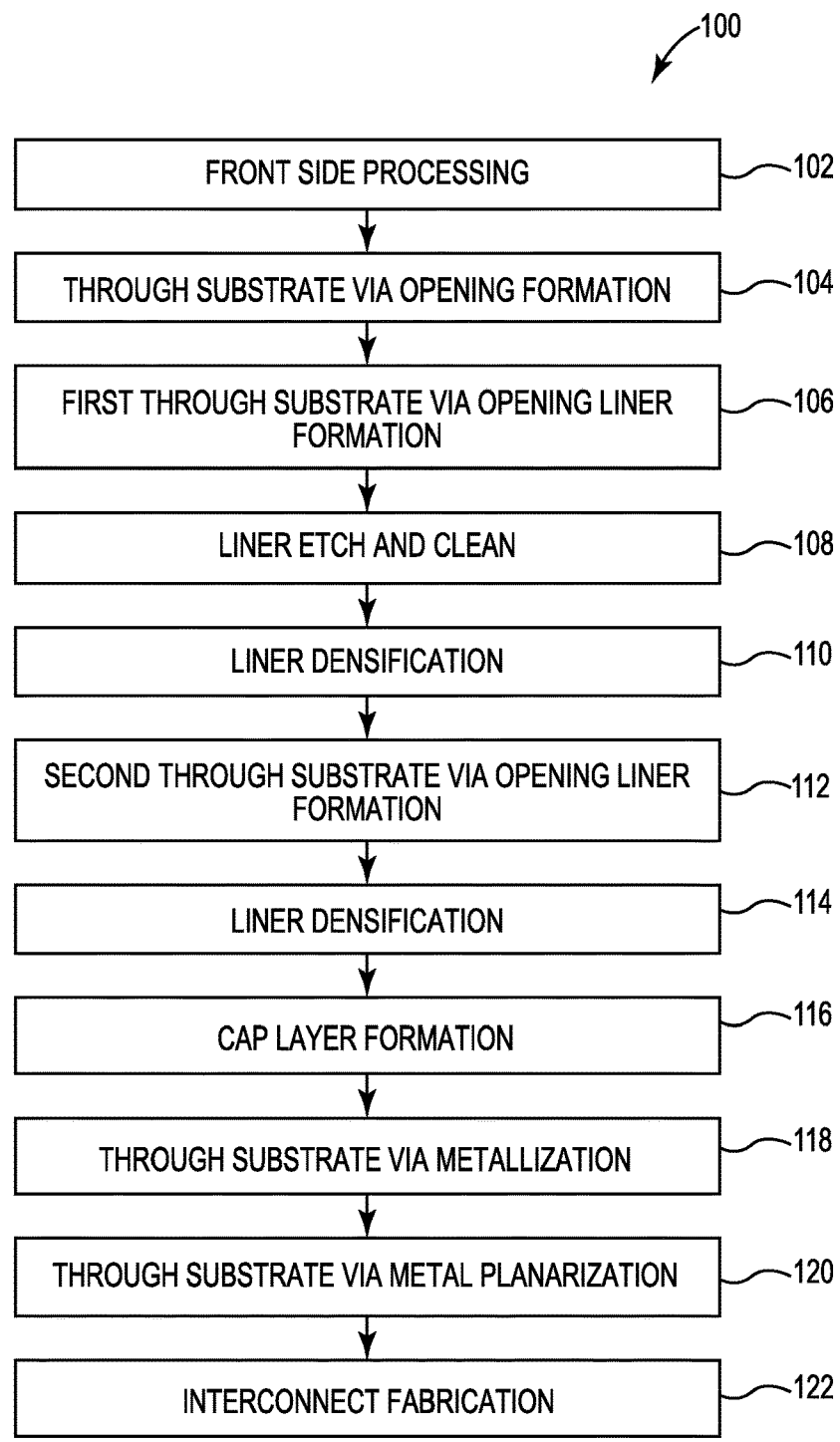
FIG. 1 is a flow diagram of a method in accordance with an embodiment of the present disclosure.

Apparatuses and methods for through substrate via (TSV) insulating liner densification are disclosed herein. Embodiments of the disclosure include a TSV liner layer formed with a process that includes one or more liner densification processes. For example, a first liner densification process may be performed after a first liner deposition step, and a second liner densification step may be performed after a second liner densification step. Liner densification may result in improved reliability due to dielectric liner moisture desorption, liner density increase and hence reduced or eliminated liner cracking and/or reduced or eliminated residual pumping of TSV metal. Certain details are set forth below to provide a sufficient understanding of embodiments of the disclosure. However, it will be clear to one skilled in the art that embodiments of the disclosure may be practiced without various of these particular details. In some instances, well-known device components, circuits, control signals, timing protocols, and software operations have not been shown in detail in order to avoid unnecessarily obscuring the described embodiments of the disclosure.

Semiconductor devices are increasingly including multiple die packed together. For example, a number of die may be formed into an electrically connected stack configured to perform varying commands. To connect the stack of die, through substrate via openings may be formed in a die that provide electrical pathways through the die, and to electrically connect the die to one another. Conductive metals and various barrier and/or insulator layers may be formed in and around the through substrate via openings to form a TSV, where the TSV provides the electrical pathway from one side of a die to another through the substrate. The substrate may also include one or more active layers, e.g., transistors, on at least one side of the substrate. The TSV structure (e.g., the physical arrangement of the various metals, insulators, and/or barrier layers), however, may have deleterious effects on the semiconductor device performance and/or reliability.

For example, TSV structures that include a thin insulator layer, may increase the parasitic capacitance of the TSV, and may also result in one or more reliability concerns. An example of a reliability concern may include the formation of cracks in the insulator layer(s) due to the unsmooth or defective TSV sidewall before liner deposition, and/or due to the stress applied on the TSV structure including sidewall liners during downstream processing. Cracks in the insulator layer(s) may also be due to a mismatch of the coefficient of thermal expansion (CTE) between the TSV conductor and the substrate. Cracks formed in the insulator layer(s) may result in metal migration, metal defect growth, and/or substrate cracking. Any of these reliability defects may cause the semiconductor device to perform poorly, or not at all. A relatively thick insulator layer, or layers, may provide relatively low TSV capacitance. The thick insulator layer may also provide better coverage of TSV sidewall scallops and striations, while providing more buffer space between a TSV conductor and the substrate. Further, various other reliability improvements may be made, reduced TSV conductor residual pumping with reduced TSV metal volume, for example. Additionally, moisture absorption by the TSV liner, which may be due to its porosity, may be addressed to reduce any reliability concerns associated with moisture absorption/outgassing.

One solution that may solve this reliability concerns may be a liner densification process. The liner densification process may include heating a die, semiconductor wafer including the die, etc. that includes a through substrate via and at least one TSV liner, e.g., an insulator layer, to a temperature that may cause densification of the TSV liner. The internal stress/strain of the TSV liner may also be altered, e.g., changed from compressive to tensile, or vice versa. The liner densification process may promote moisture desorption from TSV liner layers, and to promote densification of the same TSV liner layers. The moisture desorption may reduce or eliminate moisture absorbed by the liner layers that may outgas during any subsequent anneal steps, such as a TSV metal anneal, or a downstream thermal treatment. Residual moisture outgassing during the TSV metal anneal or downstream thermal treatment may damage the TSV resulting in reliability concerns and/or failed devices. The densification of the TSV liners may not only provide harder and less cracking liner during downstream processing, but also reduce the aspect ratio for following TSV metallization process and ensure a void free fill for a more reliable TSV. The densified liner(s) before TSV metallization processes are also expected to have less volume or sidewall thickness reduction in radial direction during TSV metal anneal, leading to more TSV metal protrusion (plastic deformation) in the axial direction for TSV CMP to remove, and hence less residual TSV pumping during downstream thermal treatment.

FIG. 1 is a flow diagram of a method 100 in accordance with an embodiment of the present disclosure. The method 100 may be a semiconductor processing sequence that includes multiple anneal steps incorporated to desorb moisture and/or increase the density of one or more insulator layers. In some embodiments, the insulator layers may include one or more TSV liner layers. The liner layers may at least be formed on the sidewalls of through substrate via openings so that a conductor may be formed therein. The conductor may provide an electrical conductive path from one side of a semiconductor die to another, for example. Moisture desorption and/or liner densification may improve reliability of a semiconductor device. In some embodiments, the liner(s) may be relatively thick so that a parasitic capacitance associated with the TSV may be reduced.

The method 100 may begin at step 102, which may include front side processing. As used herein, front side processing may include the plurality of processing steps to form an active area of a semiconductor die. For example, front side processing may include circuit formation through numerous epitaxial growths, oxide depositions/etches, metal depositions/etches, and include numerous photolithography steps that accompany many of the depositions/etches. Subsequent to the formation of the active area, a chemical mechanical planarization (CMP) stop layer may be formed over the active area, which may protect the active area during subsequent CMP processes. The front side processing may be performed on a first side of a substrate. In some embodiments, the substrate may be silicon, germanium, or a combination thereof. In some embodiments, the substrate may be any semiconductor substrate material other than silicon, germanium, or combinations thereof.

The method 100 may continue at step 104, which may include formation of a through substrate via opening in the substrate. The through-substrate via opening may be formed by etching through the active area and at least partially through the substrate. In some embodiments, the through substrate via opening may be formed completely through the substrate. Regardless, the through-substrate via opening may be formed by chemical and/or physical means, with chemical etching, drilling, and laser ablation being a few examples. The through substrate via opening may be used to form through substrate vias (TSVs), where a TSV may include one or more barrier and/or liner layers and one or more conductors so that a conductive path is formed through, or partially through, a substrate. The through substrate via opening, therefore, may be the opening, e.g., a hole, formed in a substrate as a basis for a subsequently formed TSV.

The method 100 may continue at step 106, which may include formation of a first through substrate via opening liner, e.g., a first TSV liner. The first liner may be an insulator or a dielectric, such as silicon dioxide or silicon oxide. The liner may be formed using a chemical vapor deposition process (CVD), such as Sub Atmospheric CVD (SACVD). In some embodiments, the liner may be an ozone (O3) tetraethylorthosilicate (TEOS) oxide process, as may be known in the art. The O3/TEOS process may be used to form the liner layer on sidewalls of the through substrate via opening, and may also form a liner layer on a top side of the substrate, and bottom of through substrate via opening. Due to the potentially steep sidewalls and the depth of the through substrate via opening, it may be desirable for the first liner layer to provide adequate step coverage. For example, the first TSV liner layer may have a thickness from 1500 to 6000 Å at sidewall. In some embodiments, the desired step coverage of the first liner layer may be obtained with the O3/TEOS oxide process.

The method 100 may continue at step 108, which may include a liner etch and clean. In some embodiments, the liner etch may be a dry etch and the clean may include a wet process. For example, the dry etch may be a carbon hexafluoride based dry etch configured to etch the O3/TEOS oxide. The etch may be included in the method 100 to at least reduce or eliminate the first liner layer formed on the top side of the substrate, which may aid a subsequent planarization process. The clean may be used to remove any etch particulates from the surface of the substrate and from the through substrate via opening. The clean may at least include a water rinse, for example. The nature of the O3/TEOS oxide, however, may be such that moisture from the clean and rinse may be absorbed by the layer, which may not be desirable. In some embodiments, step 108 may be optional in the method 100.

The method 100 may continue at step 110, for example, which may include liner densification. The liner densification may include heating, e.g., annealing, the first liner layer, in order to promote liner densification and/or moisture desorption. In some embodiments, the liner densification process may result in the first TSV liner layer reducing in thickness by around 15%, e.g., a liner layer of 3500 Å may be 3000 Å after the liner densification process. The heating may be performed in a separate tool, a tube furnace for example, and may include an inert gas. For example, densifying the liner may include annealing the liner at a temperature in the range from 300° C. to 500° C. for 20 to 60 minutes under nitrogen ($N_2$) gas. In some embodiments, the anneal may be similar to subsequent anneals the substrate may experience in the method 100, a TSV metal anneal for example. In some embodiments, the step 110 may be performed in situ prior to formation of a second liner, such as the step 112 for example.

The method 100 may continue at step 112, which may include formation of a second through substrate via opening liner, e.g., a second TSV liner. The second liner layer may be formed substantially similar to the first liner layer, and may be substantially similar in thickness. For example, the second liner may be an O3/TEOS oxide film deposited over the first liner layer on the sidewalls, bottom and the top side of the substrate. The second liner layer may be included to ensure the desired step coverage is achieved, which may be provided by the O3/TEOS oxide deposition. In embodiments where the liner densification is performed in situ with the formation of the second liner layer, the liner densification may be performed in the CVD chamber, e.g., the tool used to deposit the TSV liner, before the active gasses are introduced into the CVD chamber for O3/TEOS oxide deposition.

The method 100 may continue at step 114, which may include liner densification. Similar to step 110, step 114 may include heating the second liner layer to an elevated temperature in order to at least promote densification of the second liner layer. Any moisture in the first and second liner layers may additionally be desorbed during the liner densification of step 114. Additionally, step 114 may be performed in situ post step 112. For example, after the second liner deposition occurs, the substrate may be kept in the CVD chamber for the liner densification. In some embodiments, the liner densification may occur in a separate tool, such as a tube furnace in an inert atmosphere, $N_2$ for example. In some embodiments, the liner densification may occur in situ with step 116. In some embodiments, the liner densification may include annealing the liner at a temperature in a range from 300° C. to 500° C. for 20 to 60 minutes under nitrogen ($N_2$) gas.

The method 100 may continue at step 116, which may include formation of a cap layer. The cap layer may be a dielectric, silicon oxide for example, and may also be a TEOS-based oxide. In embodiments where the cap layer is a TEOS-based oxide, the cap layer may be formed differently than either the first or second liner layers. For example, whereas the first and second liner layers may be formed using a CVD O3/TEOS process, the cap layer may be an oxide deposited using a PECVD (plasma enhance chemical vapor deposition) TEOS process. The cap layer may be thinner than the first and second liner layers, and provide a moisture barrier. For example, the cap layer may be a thickness from 300 to 1000 Å. The desire for the cap layer to be a moisture barrier may guide the deposition process. While the foregoing liner layers and cap layer were discussed in regards to oxide, other dielectrics may also be used in the method 100, such a silicon nitride. The step 116 may either be ex situ deposited in different tool, or in situ deposited in the same deposition tool or chamber as step 112 or 114.

The method 100 may continue at step 118, which may include formation of a through substrate via metallization, e.g., a TSV metal. The TSV metallization may include the deposition of one or more metals using one or more metal deposition techniques. For example, first and second metal layers may be barrier and metal seed layer by physical vapor deposition (PVD) technique, and the third metal layer may be used to fill the through substrate opening by electroplating. In some embodiments, the TSV metal may be copper. Step 118 may further include a metal anneal step, which may be performed at 400° C. to 500° C. for 15 to 90 minutes in an inert atmosphere. In some embodiments, the TSV metal anneal may be similar to the first and/or second liner densification steps, such as steps 110 and 114. The TSV metal anneal step may be performed to promote and/or speed up copper grain growth. Copper grain growth may occur on its own without the TSV metal anneal, but the TSV metal anneal may provide control over the timing and nature of the copper grain growth.

The method 100 may continue at step 120, which may include through substrate via metal planarization. In some embodiments, the via metal planarization may be a chemical mechanical planarization (CMP). The CMP of the TSV metal may be performed to remove the first liner layer, and/or the second liner layer, the oxide cap layer, and the TSV metal from the top side of the substrate. Removal of these layers may allow access to the active layers included on the top side of the substrate. The CMP may remove the layers but stop at a CMP stop layer included on the substrate (discussed above).

The method 100 may continue at step 122, which may include interconnect fabrication. The interconnect fabrication may include forming bond pads and/or bond pillars that connect to the active area of the substrate and further provide bonding sites for external connections.

The liner densification steps of the method 100, steps 110 and 114 for example, may be included to promote moisture desorption from the first and/or second TSV liner layers, and to promote densification of the same TSV liner layers. The moisture desorption may reduce or eliminate moisture absorbed by the two liner layers that may outgas during any subsequent anneal steps, such as a TSV metal anneal. Residual moisture outgassing during the TSV metal anneal may damage the TSV resulting in reliability concerns and/or failed devices. And the densification of the first and second TSV liners may reduce or eliminate the liner crack and/or residual TSV metal pumping during the downstream processing.

FIGS. 2A-2H show cross-sectional views of a substrate at various stages of a process 200 according to an embodiment of the present disclosure. The FIGS. 2A-2H may depict a fragment of a substrate after one or more process steps, such as steps of the method 100, have been performed. As used with reference to FIGS. 2A-2H, the general term "substrate" may refer to the substrate and the various other components formed thereon up to that step of the process 200. For example, stating that the substrate may be heated, would mean that the substrate and all components formed thereon to that stage are heated.

FIG. 2A shows a portion of a substrate 202 after front side processing has occurred, which may provide the active area 204 on a top surface of the substrate 202. In some embodiments, the substrate 202 may be silicon, germanium, a silicon-containing material, or combinations thereof. In some embodiments, the substrate 202 may be any semiconductor material other than silicon, such as gallium arsenide, indium phosphide, gallium nitride, etc. The active area 204 may include one or more layers of active circuit elements, such as transistors, capacitors, and resistors, which have been formed during one or more integrated circuit processes, as is known in the art. The active area 204 may be capped by a CMP stop layer (not shown).

FIG. 2B shows a through substrate via opening 206 formed through the active area 204 and at least partially through the substrate 202. The through substrate via opening 206 may be formed using wet or dry etching techniques, such as ion milling, laser ablation, inductively coupled reactive ion etching, or any method known in the art. The through substrate via opening 206 may provide an opening for forming conductive elements through the substrate 202, such as TSVs. The TSVs, as used herein, may include one or more barrier layers, one or more liner layers, and one or more conductors.

FIG. 2C shows a first liner layer 208 formed on the substrate. For example, the first liner layer 208 may be formed on a top surface of the substrate, and on sidewalls and the bottom of the through substrate via opening 206. The first liner layer 208 may be a first TSV liner layer having a thickness from 1500 to 6000 Å at sidewall. The first liner layer may be an insulator, oxide for example, and may provide a protective layer separating the substrate 202 and active layer 204 from a later processing step, for example, formation of a TSV conductor (see FIG. 2G, for example). The first liner layer 208 may be formed using a deposition process, such as CVD, for example. In some embodiments, the first liner layer 208 may be formed with a CVD O3/TEOS oxide deposition process.

Figure 2F:
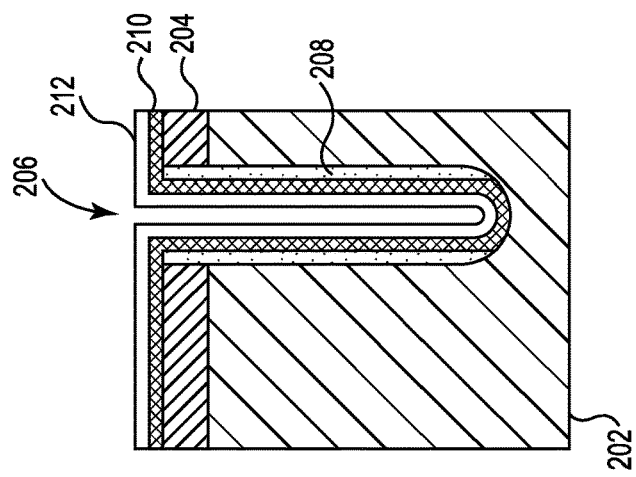
Figure 2E:
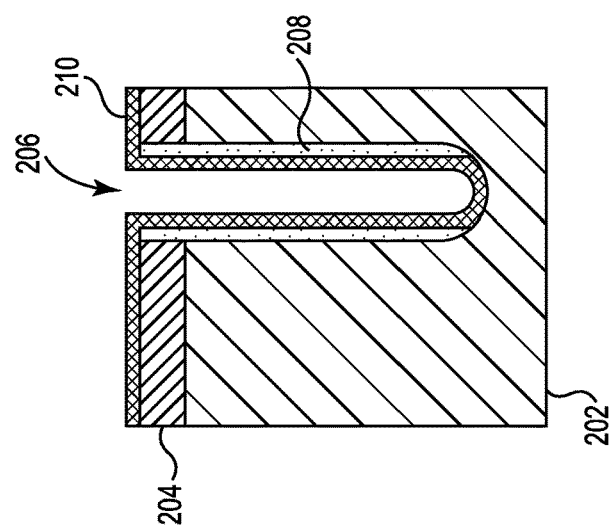
Figure 2D:
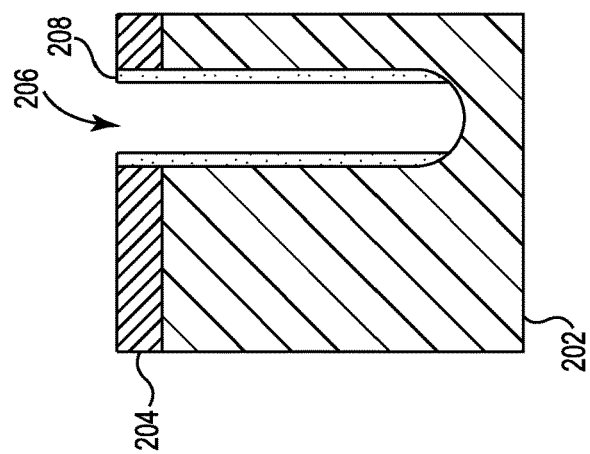

FIG. 2D shows the first liner layer after an etch process and a clean process have been performed on the substrate. The etch step may be a dry etch in some embodiments, and may be performed to remove, at least some of, the first liner layer on the active area 204, and at the bottom of the through substrate via opening 206. The dry etch may be a directional etch, which may not etch as much of the first liner off the sidewalls. In some embodiments, the etch may be performed to reduce the requirements of a subsequent etch back or planarization process. The clean may be included to remove any particulates from the substrate produced during the etch process. In some embodiments, the clean may be a wet process that includes a water rinse.

After the etch and clean processes have been performed, liner densification may be performed on the first liner layer 208. Similar to step 110 of the method 100, the substrate including the first liner layer 208 may be heated, for example, to a temperature between 300° C. to 500° C. for 20 to 60 minutes in an inert atmosphere, e.g., annealed. After liner densification is performed, the thickness of the first liner layer 208 may be reduced for example, by 15%, in some embodiments. The anneal may be performed in a tube furnace, for example, or it may be performed in the tool used to form the second liner layer 210, see FIG. 2E below. If performed by the tool used to form the second liner layer 210, the liner densification may be performed before the reactive gases are introduced into the tool to form the second liner layer 210. For example, the substrate may be heated to a desired temperature for a desired time in a nitrogen atmosphere before the substrate is exposed to the active gases for the formation of the second liner layer 210. The liner densification may further result in moisture desorption from the first liner layer 208 and/or promotion of densification of the first liner layer 208.

FIG. 2E shows the second liner layer 210 formed on the substrate 202. The second liner layer 210 may be a second TSV liner layer, for example. The second liner layer 210 may be an oxide layer formed similar to the first liner layer and be of similar thickness. As such, the first and second liner layers 208, 210 may have a combined thickness from 5000 to 12000 Å at sidewall. For example, the second liner layer 210 may be an oxide layer deposited using a CVD O3/TEOS process.

A second liner densification may be performed after the second liner layer 210 is formed on the substrate. The liner densification may be similar to the liner densification performed on the first liner layer 208, for example. Step 116 of the method 100 may be an example liner densification, in some embodiments. The liner densification may include annealing the substrate at 300° C. to 500° C. for 20 to 60 minutes in an inert atmosphere, such as $N_2$. Densifying the first and second liner layers 208, 210 may not only improve the moisture desorption and hence less outgassing, but also increase the liner density and hence less liner crack and/or less residual pumping.

FIG. 2F shows a cap layer 212, which may be formed over the second liner layer 210. The cap layer 212 may be an oxide layer of different characteristics than that of the first and second liner layers 208, 210. The cap layer 212 may provide a moisture barrier, in some embodiments. The cap layer 212 may, as a result, may be deposited using a different CVD process. For example, the cap layer 212 may be a PECVD deposited TEOS oxide, which may provide better moisture resistance than a CVD O3/TEOS deposited oxide. The cap layer 212 may also be thinner than the first and second liner layers 208, 210.

Figure 2H:
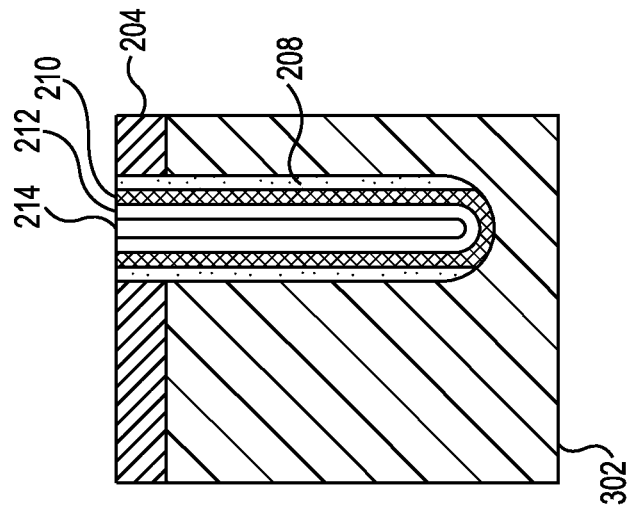
Figure 2G:
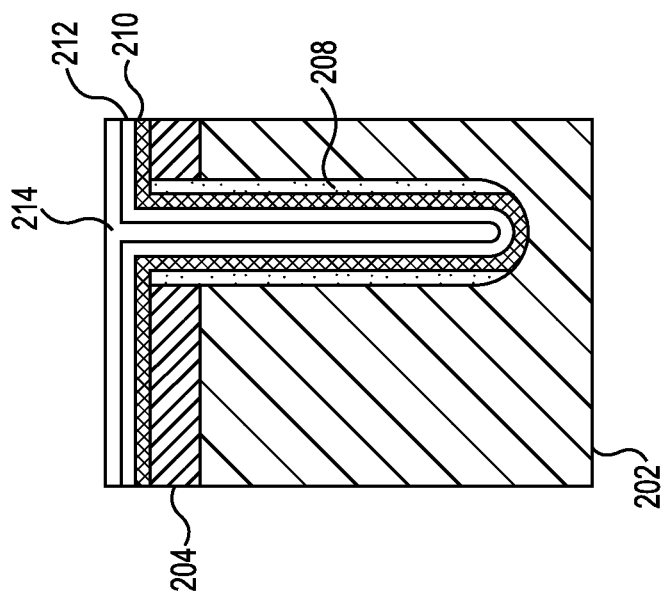

FIG. 2G shows a conductor 214 formed in the through substrate via opening 206. The conductor 214 may be deposited on the oxide cap layer 212 and fill the remaining volume of the through substrate via opening 206. The conductor 214 may be one or more metals, copper for example, and may be deposited using various metal deposition processes. For example, a copper barrier and seed layer may be deposited by a PVD process before the remaining volume is filled with copper using a electro plating process, for example.

FIG. 2H shows the removal of portions of the first and second liner layers 208, 210, the cap layer 212, and the conductor 214 after an planarization process is performed on the top surface of the substrate 202. In some embodiments, the planarization process may be a CMP. The planarization process may end at an etch or polish stop layer formed over the active area 204. The etch or polish stop layer was previously described with reference to FIG. 2A. After the planarization process, as noted in method 100 at step 122, interconnects may be fabricated on at least the top surface of the active area 204. The interconnects may connect various components of the active area 204 with bonding pads and/or bonding pillars, and/or to other components of the active area 204. The TSV may be finally formed when portions of the substrate 202 are removed from a bottom surface of the substrate. The bottom surface is typically the opposite surface of the top surface of the substrate 202. Portions of a bottom surface the substrate 202 may be removed, for example, by performing CMP to the bottom surface of the substrate until at least a portion of the TSV is exposed at the bottom surface. Polishing and/or grinding the back surface of the substrate 202 may be both used. Other processes may also be used to remove portions of the bottom surface of the substrate as well.

Figure 3:
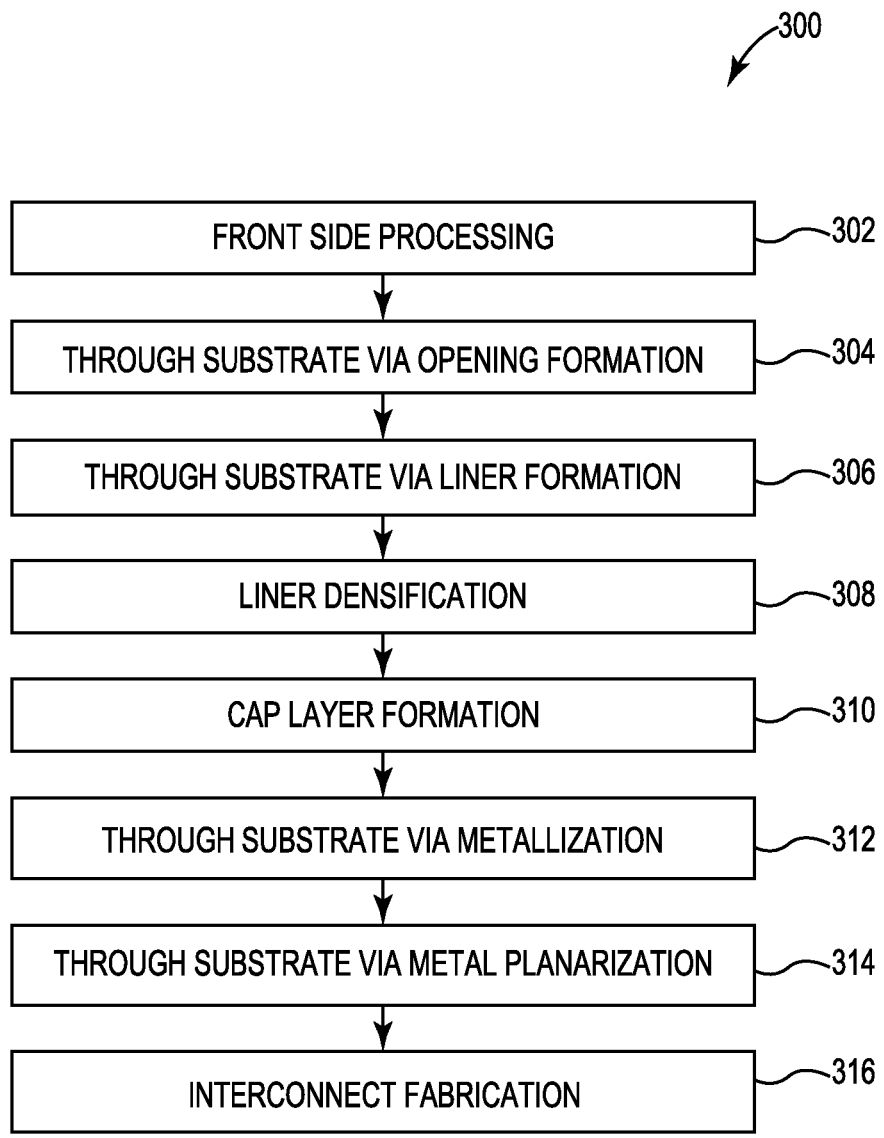
FIG. 3 is a flow diagram of a method in accordance with an embodiment of the present disclosure.

FIG. 3 is a flow diagram of a method 300 in accordance with an embodiment of the present disclosure. The method 300 may be a semiconductor processing sequence that includes the formation of a single TSV liner layer. In some embodiments, the single TSV liner may be characterized as a high step coverage layer due to the aspect ratio of the TSV opening.

The method 300 may begin at step 302, which may include front side processing. The step 302 may include the formation of an active area of an integrated circuit on a first side of a substrate, including transistors, resistors, and capacitors for example, and may conclude with the deposition of a CMP stop layer over the active area. The method 300 may continue with step 304, which may include the formation of a through substrate via opening. The through substrate via opening may be formed by etching the active area and at least part of the substrate. In some embodiments, the through substrate via opening may be formed completely through the substrate. Regardless, the through-substrate via opening may be formed by chemical and/or physical means, with chemical etching, drilling, and laser ablation being a few examples. The through substrate via opening may be used to form through substrate vias (TSVs), where a TSV may include one or more barrier and/or liner layers and one or more conductors so that a conductive path is formed through, or partially through, a substrate. The through substrate via opening, therefore, may be the opening, e.g., a hole, formed in a substrate as a basis for a subsequently formed TSV.

The method 300 may continue with step 305, which may at least include formation of a liner layer in the through substrate via opening, e.g., formation of a TSV liner. The liner may be formed from an oxide in some embodiments, but other insulator or dielectric materials may be used. Formation of the liner may at least include forming the liner over a top surface of the substrate, on bottom and on sidewalls of the through substrate via opening. The through substrate via opening may have steep sidewalls with regards to the top surface of the substrate. As a result, it may be desirable to provide high step coverage. To provide high step coverage, the liner may be thick to ensure complete sidewall coverage the through substrate via opening. In some embodiments, the liner may be of a thickness from 1500 to 8000 Å. An example deposition to provide high step coverage may be a CVD process using cycles of oxide deposition by using TEOS and ozone (O3) and in situ plasma treatment, or may be an atomic layer deposition (ALD) process.

The method 300 may continue with step 308, which may include liner densification. Liner densification may result in the liner layer reducing in thickness for example by 15%, in some embodiments. For example, a liner layer of 3500 Å may be 3000 Å after the liner densification process. The liner densification may include heating the substrate to a temperature between 300° C. and 500° C. for 20 to 60 minutes in an inert atmosphere, $N_2$ for example. The liner densification may be performed in the tool used to deposit the liner, in some embodiments. For example, after the liner has been deposited, the liner densification may be performed in the tool used for depositing the liner. In some embodiments, the liner densification may be performed in a separate tool, an anneal furnace for example. Regardless of tool, the effect of the liner densification may be the same.

The method 300 may continue with step 310, which may include formation of a cap layer. The cap layer may be formed over the liner layer, and may provide a moisture barrier, in some embodiments. In some embodiments, the cap layer may be thinner than the liner layer. For example, the cap layer may be a thickness from 300 to 1000 Å. The cap layer may be formed from an oxide with characteristically better moisture barrier properties. For example, the cap layer may be a PECVD TEOS oxide. In some embodiments, the liner densification may be performed in situ with the formation of the cap layer. For example, the liner densification may be performed prior to the gases are introduced into the PECVD chamber to deposit the oxide layer.

The method 300 may continue at step 312, which may include through substrate via metallization, e.g., TSV metallization. The TSV metallization may include the deposition of one or more metals using one or more metal deposition techniques. For example, a first and a second metal layer may be barrier and metal seed layer by physical vapor deposition (PVD) technique, and the third metal layer may be used to fill the through substrate opening by electro plating. In some embodiments, the TSV metal may be copper. Step 118 may further include a metal anneal step, which may be performed at 400° C. to 500° C. for 15 to 90 minutes in an inert atmosphere. In some embodiments, the TSV metal anneal may be similar to the liner densification, such as step 308. The TSV metal anneal step may be performed to promote and/or speed up copper grain growth. Copper grain growth may occur on its own without the TSV metal anneal, but the TSV metal anneal may provide control over the timing and nature of the copper grain growth.

The method 300 may continue at step 314, which may include through substrate via metal planarization. In some embodiments, the planarization may be a chemical mechanical planarization (CMP). The planarization of the TSV metal may be performed to remove the liner layer, the cap layer, and the TSV metal from the top side of the substrate. Removal of these layers may allow access to the active layers included on the top side of the substrate. The planarization may remove the layers but stop at an etch or polish stop layer included on the substrate (discussed above).

The method 300 may continue at step 316, which may include interconnect fabrication. The interconnect fabrication may include forming bond pads and/or bond pillars that connect to the active area of the substrate and further provide bonding sites for external connections. The liner densification of the method 300 may be performed to improve the TSV reliability by reducing the liner cracking, outgassing, as well as reducing residual pumping by the TSV metal.

Figure 4C:
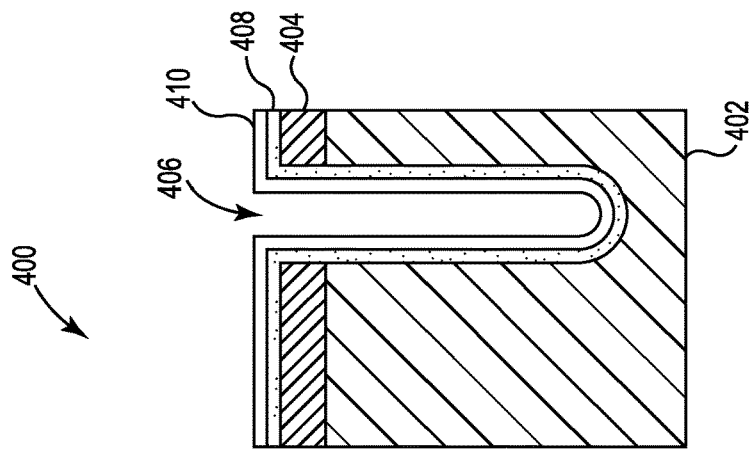
FIGS. 4A-4C show cross-sectional views of a substrate at various stages of a process according to an embodiment of the present disclosure.
Figure 4B:
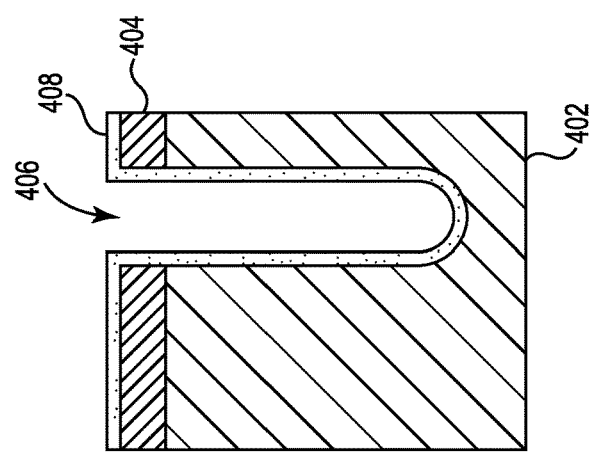
Figure 4A:
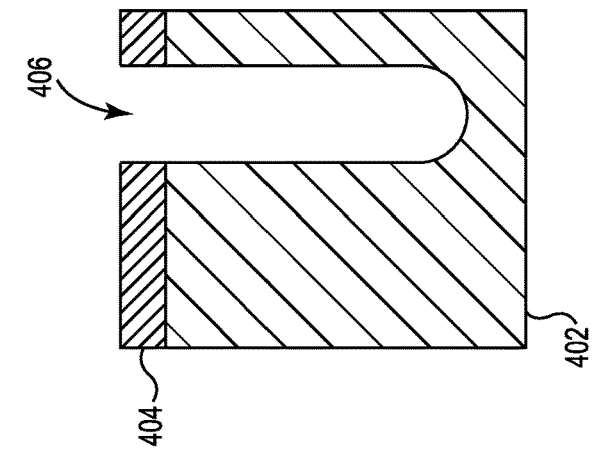

FIGS. 4A-4C show cross-section views of a substrate at various stages of a process 400 according to an embodiment of the present disclosure. The process 400 may also include steps of the process 200, but have been omitted here for sake of brevity. For example, steps of the process 200 depicted in FIGS. 2A, 2G, and 2H may also be included in the process 400.

FIG. 4A shows a substrate 402 after formation of an active layer 404 and a through substrate via opening 406. The substrate 402 may be silicon, germanium, or a combination thereof. In some embodiments, the substrate 402 may be any semiconductor material other than silicon, such as gallium arsenide, indium phosphide, gallium nitride, etc. The active area 404 may be formed on a top surface of the substrate 402 and include active circuit elements, such as transistors, resistors, and capacitors for example, formed to make one or more integrated circuits. The through substrate via opening 406 may be formed by wet etching, dry etching, ion milling, or combinations thereof, and may be formed at least partially through the substrate 402. The through substrate via opening 406 may provide a conduit for electrical coupling through the substrate 402.

FIG. 4B shows the substrate after formation of the liner 408. The liner 408 may be a TSV liner, for example. The liner 408 may be a high step coverage oxide layer formed on the substrate 402, and sidewalls of the through substrate via opening 406. In some embodiments, the liner 408 may have a thickness of 1500 to 8000 Å at TSV sidewall. The liner 408 may be formed using a CVD process, such as SACVD, with ozone and TEOS, for example. A liner densification may be performed after formation of the liner 408. The liner densification may result in the thickness of the layer 408 reducing for example, by 15%. The liner densification may include annealing the substrate at 300° C. to 500° C. for 20 to 40 minutes in an inert atmosphere, such as $N_2$. Densifying the liner 408 may not only improve the moisture desportion and hence less outgassing, but also increase the liner density and hence less liner crack and/or less residual pumping.

FIG. 4C shows the substrate after formation of a cap layer 410, which may be formed over the liner 408. The cap layer 410 may be an oxide layer of different characteristics than that of the liner 408, and may be thinner than the layer 408. For example, the cap layer 410 may have a thickness of 300 to 1500 Å. The cap layer 410 may provide a moisture barrier, in some embodiments. The cap layer 410 may, as a result, be deposited using a different CVD process. For example, the cap layer 410 may be a PECVD deposited TEOS oxide, which may provide better moisture resistance than an O3/TEOS deposited layer.

The liner densification may help reduce or eliminate potential reliability concerns for TSVs with liner moisture adsorption and outgassing concerns. The densification of the TSV liners may not only provide harder and less cracking liner during downstream processing, but also reduce the aspect ratio for following TSV metallization process and ensure a void free fill and hence a more reliable TSV. The densified liner before TSV metallization processes are also expected to have less volume or thickness change in radial direction during TSV metal anneal, leading to more TSV metal protrusion (plastic deformation) in the axial direction for TSV CMP to remove, and hence less residual TSV pumping during downstream thermal treatments.

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:

1. A method, comprising:
  forming a through substrate via through at least a portion of a substrate;
  forming, in a tool, a first liner layer in the through substrate via, the first liner layer being non-conductive;
  etching the first liner layer;
  before introducing reactive gases in the tool, densifying the first liner layer, wherein densifying the first liner layer comprises annealing the first liner layer:
  cleaning the substrate and an etched first liner layer with water of etched particulates;
  forming a second liner layer on the first liner layer and the cleaned substrate; and before introducing additional reactive gases in the tool, densifying the second liner layer, wherein densifying the second liner layer comprises annealing the second liner layer.

2. The method of claim 1, wherein the first liner layer is annealed at a temperature of about 300° C. to 500° C. in an inert atmosphere.

3. The method of claim 1, wherein the reactive gases are introduced into the tool to form the second liner layer.

4. The method of claim 1, wherein the second liner layer is annealed a temperature of about 300° C. to 500° C. in an inert atmosphere.

5. The method of claim 1, herein the additional reactive gases are introduced into the tool to form a cap layer.

6. The method of claim 1, further comprising:
   forming a cap layer on the second liner layer; and
   forming a conductor inside the through substrate via such that the first liner layer, the second liner layer, and the cap layer are disposed between the substrate and the conductor.

7. The method of claim 1, further comprising:
   forming a cap layer on the first liner layer; and
   forming a conductor inside the through substrate via such that the first liner layer and the cap layer are disposed between the conductor and the substrate.

8. A method, comprising:
   forming, in a tool, a first liner layer in a through substrate via formed in a substrate;
   before introducing reactive gases in the tool for formation of a second liner layer, densifying the first liner layer;
   etching the first liner layer to produce particulates of the first liner layer on the substrate;
   before forming the second liner layer, rinsing with water the substrate to clean the substrate of the particulates of the first liner layer on the substrate;
   forming the second liner layer over the first liner layer and the cleaned substrate;
   before introducing additional reactive gases in the tool, densifying the second liner layer; and
   forming an oxide cap layer over the second liner layer.

9. The method of claim 8, further comprising:
   forming a conductor over the oxide cap layer; and
   removing portions of the first liner layer, the second liner layer, and the conductor from a top surface of the substrate.

10. The method of claim 8, further comprising:
    forming a chemical mechanical planarization layer stop layer on a top side of the substrate; and
    forming the through substrate via at least partially through the substrate.

11. The method of claim 8, wherein forming the first liner layer in the through substrate via formed in the substrate comprises depositing an oxide in the through substrate via in the substrate using a chemical vapor deposition ozone-tetraethylorthosilicate (TEOS) process.

12. The method of claim 8, wherein forming the oxide cap layer over the second liner layer comprises depositing an oxide layer on the second liner layer using a plasma enhanced chemical vapor deposition TEOS process.

13. The method of claim 8, wherein densifying the first liner layer comprises annealing the first liner layer at a temperature of 400° C.

14. The method of claim 8, wherein etching the first liner layer to produce the particulates of the first liner layer on the substrate comprises:
    dry etching portions of the first liner layer from the top side of the substrate.

15. The method of claim 8, wherein forming, in the tool, the first liner layer in the through substrate via formed in the substrate comprises:
    forming the through substrate via at least partially through the substrate; and
    depositing the first liner layer in the through substrate via.

16. The method of claim 8, further comprising:
    annealing the second liner layer at a temperature of about 300° C. to 500° C.; and
    wherein forming the oxide cap layer over the second liner layer comprises using a plasma enhanced chemical vapor deposition tetraethylorthosilicate (TEOS) process.

17. The method of claim 8, wherein densifying the first liner layer comprises annealing the first liner layer to a temperature of about 300° C. to 500° C. in an inert atmosphere.

18. The method of claim 8, wherein the first and second liner layers are both formed using a chemical vapor deposition ozone-tetraethylorthosilicate process.

19. The method of claim 8, further comprising:
    depositing a metal over the oxide cap layer;
    annealing the metal; and
    removing the metal, the oxide cap layer, the second liner layer, and the first liner layer using chemical mechanical planarization.

20. The method of claim 8,
    wherein the second liner layer is a high step coverage liner layer.

21. The method of claim 8, wherein densifying the second liner layer comprises:
    before forming the oxide cap layer, annealing the second liner layer in the tool before introducing the additional reactive gases, wherein the additional reactive gases form the cap layer.

22. The method of claim 8, wherein the second liner layer is formed using a sub atmospheric chemical vapor deposition ozone-tetraethylorthosilicate (O3/TEOS) process, and wherein the oxide cap layer is formed using a plasma enhanced chemical vapor deposition TEOS process.

* * * * *